／United States Patent

[11] 3,582,793

[72] Inventors Paul V. Bates
Breslau, Ontario;
William M. Harrold, Kitchener, Ontario,
both of, Canada
[21] Appl. No. 801,616
[22] Filed Feb. 24, 1969
[45] Patented June 1, 1971
[73] Assignee Electrohome Limited
Kitchener, Ontario, Canada

[54] A.F.C. CIRCUITRY FOR SUPERHETERODYNE RECEIVERS
24 Claims, 7 Drawing Figs.

[52] U.S. Cl. 325/418, 178/7.3, 325/422
[51] Int. Cl. H04b 1/26
[50] Field of Search 178/5.8, 5.8 A, 7.3 E, 7.5 E; 325/418, 422, 423

[56] References Cited

UNITED STATES PATENTS 2,896,018 7/1959 Rhodes et al. 178/5.8

*Primary Examiner*—Robert L. Richardson
*Attorney*—Peter W. Mc Burney

ABSTRACT: A superheterodyne signal receiver has coarse tuning means, fine tuning means and automatic frequency control means, the latter, when abled, being effective to automatically correct any mistuning of the local oscillator of the tuner of the receiver by the fine tuning means prior to abling of the automatic frequency control means.

INVENTORS
WILLIAM M. HARROLD
PAUL V. BATES
BY
PATENT AGENT

INVENTORS
WILLIAM M. HARROLD
PAUL V. BATES
BY
PATENT AGENT

INVENTORS
WILLIAM M. HARROLD
PAUL V. BATES
BY
PATENT AGENT

INVENTORS
WILLIAM M. HARROLD
PAUL V. BATES
BY
PATENT AGENT

A.F.C. CIRCUITRY FOR SUPERHETERODYNE RECEIVERS

This invention relates to signal receivers of the superheterodyne-type. More particularly, this invention relates to tuning systems for superheterodyne signal receivers. Tuning systems embodying the invention are particularly useful in both color and black and white television receivers, but their use is not restricted thereto.

Conventional color and black and white television receivers for the most part employ continuous fine tuning with mechanical memory, or, as it is more commonly known, preset fine tuning, for local oscillator fine tuning. A conventional turret-type television tuner has a manually operated coarse tuning arrangement and a manually operated fine tuning arrangement. The coarse tuning arrangement is the channel selector. The effect of rotating the channel selector control knob to select different channels is to place different coils for different channels in the tank circuit of the local oscillator of the receiver and, optionally, to broadly tune the radio frequency amplifier or amplifiers of the tuner of the receiver. Each coil has an inductance such that, when properly tuned, the effect of placing it in the oscillator tank circuit is that the oscillator produces an output signal at a frequency such that, when this signal is heterodyned in a mixer with the video carrier of an input signal (RF signal) to the tuner of the receiver having a video carrier frequency corresponding to the video carrier frequency for the selected channel, the tuner produces an output signal (video IF signal) having a video carrier frequency that is the same as the video carrier intermediate frequency of the receiver, i.e., the frequency to which the IF system of the receiver is tuned, this frequency currently being 45.75 MHz. Once a channel has been selected, the effect of rotating the manual fine tuning control knob is to vary the inductance of the aforesaid coil in the local oscillator tank circuit over a limited range, the frequency of the local oscillator signal thus being caused to vary over a limited range in which there is provided a signal which, when heterodyned with the video carrier of the RF input signal for the selected channel, will result in a tuner output signal having a video carrier at the video carrier intermediate frequency of the receiver. When another channel is selected, this does not change the tuning for the previous channel, and hence the tuning for the previous channel is "-preset".

Current conventional color television receivers also are provided, for the most part, with automatic frequency control systems, commonly referred to as AFT or automatic fine tuning systems. An AFT system is operable, in response to a deviation in the video carrier frequency of the output signal of the tuner from the video carrier intermediate frequency of the receiver, to automatically vary the frequency of the signal produced by the local oscillator in a direction to correct such deviation.

Prior art tuners of the aforementioned type generally have had an excessive fine tuning range, usually about 10 MHz., and generally are characterized by high, fine tuning knob torque, or, if gearing has been used to reduce the required torque, slow action requiring excessive fine tuning knob rotation. The wide fine tuning frequency range that has been permitted allows extreme mistuning, and, when this occurs, the operator, receiving little reinforcement for limited rotation of the fine tuning control knob, often will choose the incorrect direction to rotate the knob and further detune the tuner in an effort to improve picture and sound quality. This may cause the operator frustration, disappointment and embarrassment, and it also causes costly service calls in some instances.

The problem is even more acute with a color television receiver since, because of the nature of the color signal frequency spectrum, it is quite possible for a color television receiver to be fine tuned so as to provide an acceptable monochrome picture and sound but be unable to provide an acceptable color picture at the same fine tuning setting. Thus, the customer may have a receiver which seems to be properly tuned and yet which will not provide a color picture.

The industry's answer to these problems has been AFT, but AFT has not provided a complete solution for the problems. AFT does provide a solution as long as, when the AFT system is activated, the local oscillator has not been manually fine tuned beyond the pull-in range of the AFT system. Unfortunately, however, such is often not the case because prior art receivers have manual fine tuning ranges (generally about 10 MHz.) that exceed the effective pull-in ranges (generally about 2 MHz. on channel 2) of the AFT systems of the receivers. Thus, operators of such receivers can still and do get "lost" if their receivers are mistuned significantly.

Complete elimination of manual fine tuning on AFT-equipped receivers would solve the problems, but this is not a practical solution, since it is recognized that under certain combinations of signal quality, antenna system and viewer taste, manual override of the AFT system is desirable. However, the manual override need only have sufficient range to allow for demonstrable mistuning of the receiver in either direction to satisfy the operator that he has tuned through an optimum position. Of course, the selected range must be capable of producing this result under conditions of local oscillator drift due to temperature variations, humidity, aging, etc.

In accordance with the broad aspect of this invention, there is provided a superheterodyne signal receiver having coarse tuning means, fine tuning means and an AFT system in which the AFT system, when activated, is effective to automatically vary the frequency of the local oscillator signal in a direction to correct a deviation in the carrier frequency of the tuner output signal from the frequency to which the IF system of the receiver is tuned regardless of any mistuning of the oscillator by the fine tuning means of the receiver prior to activation of the automatic frequency control system. In a preferred embodiment of the invention, the fine tuning means of the receiver are restricted from mistuning the local oscillator to a point at and beyond which the AFT system, when activated, is ineffective to correct such mistuning. In other words, the frequency spectrum within which the carrier frequency of the signal produced by the tuner can be varied by the fine tuning means is wholly within the pull-in range of the AFT system, i.e., the frequency spectrum over which the AFT system, when activated, is capable of automatically varying the carrier frequency of the tuner output signal in a direction to correct a deviation in the carrier frequency of the tuner output signal from the intermediate frequency to which the IF system of the receiver is tuned.

This invention will become more apparent from the following detailed description of a preferred embodiment of the invention taken in conjunction with the appended drawings, in which.

Figure 1:
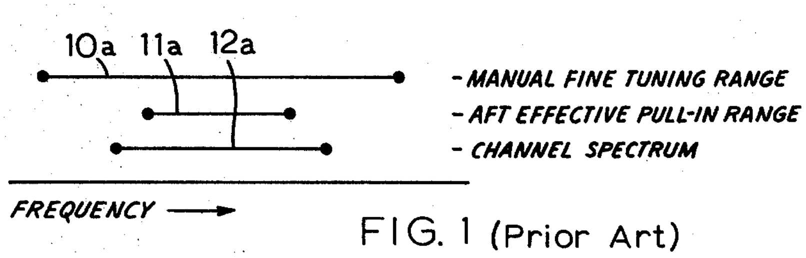
FIG. 1 (Prior Art)
FIG. 1 is a graph depicting the relative manual fine tuning range, AFT effective pull-in range and channel spectrum of a typical prior art color television receiver.

Referring first to FIG. 1, there is shown in this Figure the manual fine tuning range **10*a*, the AFT effective pull-in range 11*a* and the channel spectrum 12*a* of a conventional television receiver having AFT and preset fine tuning. The manual fine tuning range is the frequency spectrum over which the video carrier frequency of the output signal of the tuner of the receiver can be varied by the fine tuning arrangement of the receiver. It will be noted that manual fine tuning range 10***a* exceeds the AFT effective pull-in range 11*a*, so that the tuner will be mistuned beyond the point where the AFT system can correct the mistuning when fine tuned near the upper and lower limits of the manual fine tuning range. By way of contrast, and with reference to FIG. 2, there is shown the manual fine tuning range 10*b*, the AFT effective pull-in range 11*b* and the channel spectrum 12*b* of a television receiver that constitutes a preferred embodiment of this invention. The AFT effective pull-in range 11*b* exceeds the manual fine tuning range 10*b*, so that it is not possible for the tuner to be mistuned beyond the capability of the AFT system to restore optimum conditions.

Figure 6A:
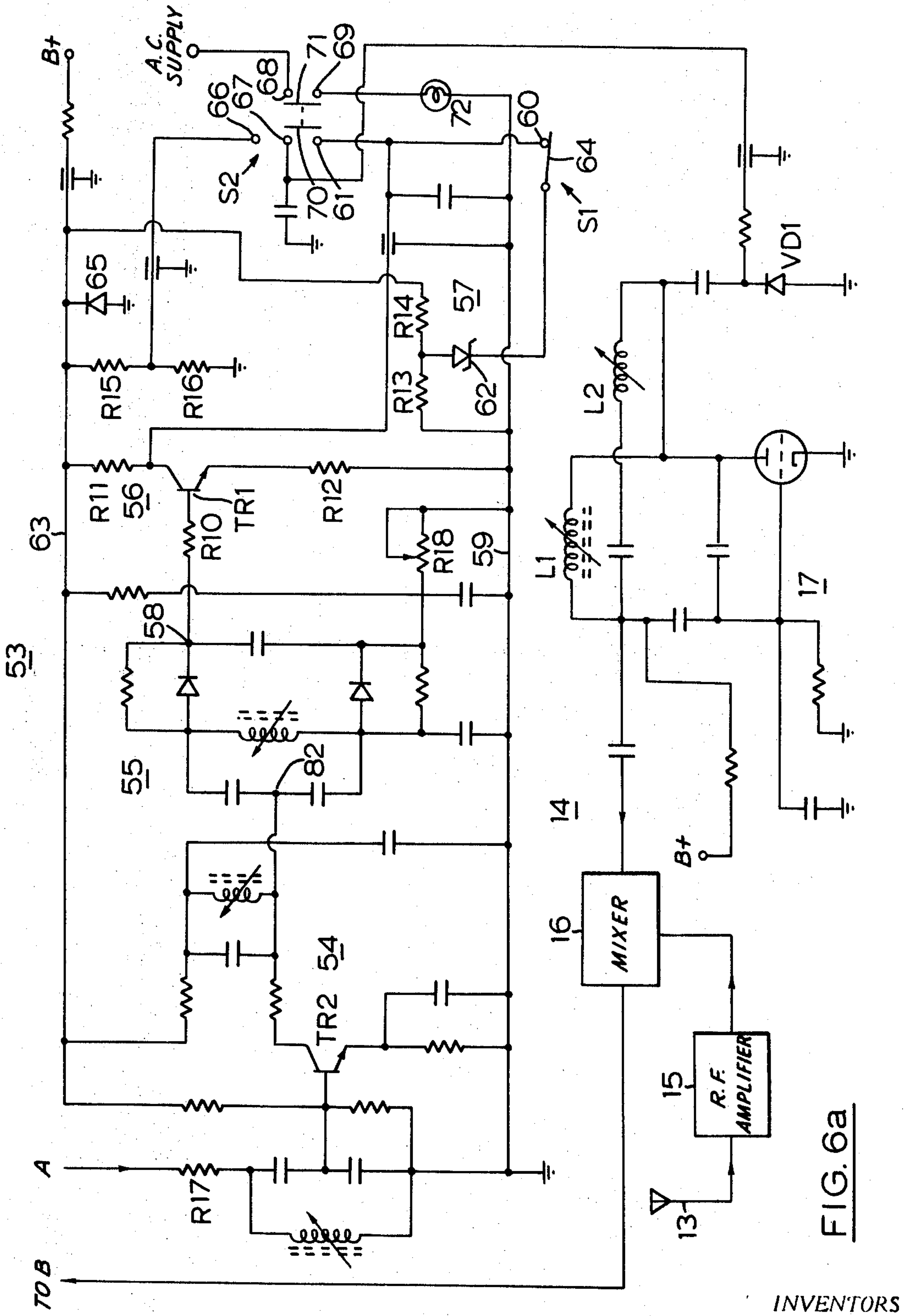
Figure 6B:
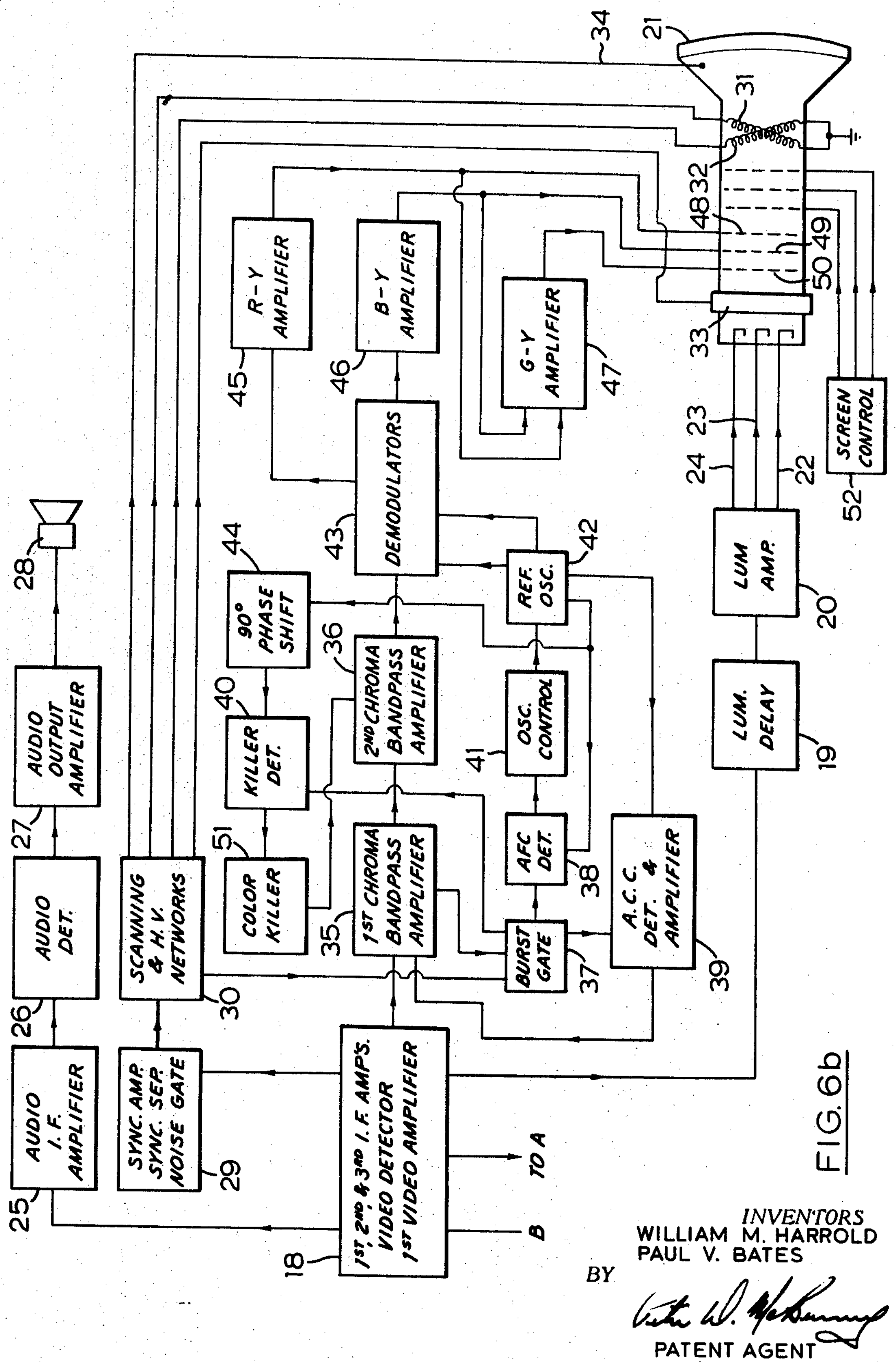

Turning now to FIGS. 6*a* and 6*b*, those skilled in the art will appreciate that many of the components of the color television receiver shown therein are conventional, so only a brief description will be given of such components of the receiver and their mode of operation. The receiver includes an antenna 13 that is connected to the input terminal of a tuner 14 that comprises one or more radio frequency (RF) amplification stages 15, a mixer 16 and a local oscillator 17, the latter two components constituting a first detector. Antenna 13 receives television signals broadcast on various channels, and the signal having a video carrier frequency corresponding to that of the channel selected is amplified by the RF amplifier or amplifiers 15 and detected, the detected signal then being applied to a network designated 18 containing one or more intermediate frequency (IF) amplifiers, a video detector and a first video amplifier. The detected signal from tuner 14 has, as is well known, a video carrier frequency (IF) that is different from the video carrier frequencies of any of the VHF television signals received by antenna 13, usually being lower in frequency. The video carrier frequency of the detected signal, because of mistuning, local oscillator drift, etc. varies over a range that includes the video carrier intermediate frequency of the receiver, this being a predetermined frequency. The detected signal is amplified by the one or more IF amplifiers, the video components of the signal detected, and the video signal amplified by the first video amplifier.

The luminance component (Y) of the video signal is derived from network 18 in a known manner, delayed by a luminance delay network 19 and then applied to the luminance amplifier and drive control network 20 for the conventional three gun picture tube 21 of the receiver. As shown, the drive control network of the luminance amplifier has three output lines 22, 23 and 24 connected to the cathodes of the "red", "green" and "blue" electron guns respectively of picture tube 21.

The audio signal is derived from network 18 in a known manner and supplied to an audio IF amplifier 25. The amplified audio signal is detected by an audio detector 26, the detected signal then being amplified by one or more stages of audio frequency (AF) amplification 27 and supplied to one or more loudspeakers 28.

Synchronizing (sync) information is derived in a known manner from network 18 and applied to a network 29 consisting of a sync amplifier, sync separator and noise gate. The sync signal output from network 29 is applied to a network 30 containing the scanning and high voltage circuits of the receiver. More specifically, network 30 comprises a horizontal scanning generator consisting of a line frequency oscillator, a phase detector and a frequency control stage for providing automatic control of the oscillator frequency; a vertical scanning signal generator; a horizontal convergence network; and a vertical convergence network. A horizontal scanning signal is developed and applied to the primary winding of an output transformer (not shown) having its secondary winding connected to the horizontal scanning coil 31 of the deflection yoke (not shown) of the receiver. A vertical scanning signal is developed and is coupled to the vertical scanning coil 32 of the deflection yoke of the receiver. Vertical and horizontal convergence signals also are developed and applied to a deflection yoke assembly shown schematically at 33. One high voltage DC output line 34 of the high voltage circuits of network 30 also is connected to picture tube 21.

An automatic gain control system (not shown) may be included within network 29 to develop an AGC potential for application to tuner 14 and one or more of the IF amplification stages of network 18, as is well known.

The chrominance component of the video signal is derived from network 18 in a known manner, amplified by first and second chrominance band-pass amplifiers 35 and 36, a part of the chrominance signal being supplied from chrominance amplifier 35 to a color burst amplifier or gate 37. Keying pulses from network 30 are applied to color burst amplifier 37, and it supplies its output to an automatic frequency control (AFC) detector 38, an automatic chroma control (ACC) detector and amplifier network 39 and a killer detector 40. AFC detector 38 provides a control signal that is applied to an oscillator control device 41 that controls the frequency of a color or reference oscillator 42. The output signal of oscillator 42 is applied to ACC detector 39, AFC detector 38, color demodulators 43 and also to killer detector 40 via a 90° phase shift network 44. The output signal of chrominance band-pass amplifier 36 is applied to demodulators 43, which may comprise a pair of synchronous demodulators for developing a red color difference signal (R-Y) and a blue color difference signal (B-Y). A green color difference signal (G-Y) is obtained by matrixing the red and blue color difference signals; and these three signals are amplified by color difference amplifiers 45, 46 and 47 and applied directly or via keyed clamps (not shown) to the control grids 48, 49 and 50 respectively of the three electron guns of picture tube 21.

The operating frequency and phase of oscillator 42 corresponds to that of the color burst signal (3.58 MHz.), and the oscillator output signal and the signal from burst amplifier or gate 37 are compared in ACC detector 39. ACC detector 39 produces a signal indicative of the reception of a color signal and that varies in magnitude with the level of the received signal. This signal is supplied to chrominance band-pass amplifier 35 to vary the gain of this amplifier to compensate for variations in the level of the received signal. The output of a color killer network 51 is applied to chrominance band-pass amplifier 36 and determines whether this amplifier is biased on or off, color killer 51 being connected to killer detector 40. In the absence of a color burst signal, color killer 51 biases chrominance band-pass amplifier 36 off.

Reference numeral 52 designates a conventional screen control network connected to the three screen electrodes of the three guns of color picture tube 21.

An automatic fine tuning (AFT) system generally designated 53 is provided for tuner 14 and is connected between local oscillator 17 and, for example, the third IF amplifier of network 18. AFT system 53 is conventional in part in that it includes an amplifier 54 tuned to 45.75 MHz. i.e., the intermediate frequency to which the IF system of the receiver is tuned, and a discriminator 55. Unlike conventional AFT systems, however, AFT system 53 also includes a DC amplifier 56 and a clipper 57. Like a conventional AFT system, AFT system 53 is operable in response to a deviation in the video carrier frequency of the output signal of tuner 14 from the frequency to which the IF system of the receiver is tuned to automatically vary the frequency of the signal produced by local oscillator 17 in a direction to correct the deviation.

DC amplifier 56 includes an amplifying device in the form of a transistor TR1. The base electrode of transistor TR1 is connected to the output terminal 58 of discriminator 55 via a resistor R10. The collector electrode of transistor TR1 is connected to the positive terminal of a DC power supply ($B^+$) via a resistor R11, while the emitter electrode of the transistor is connected via a resistor R12 to a conductor 59 at a more negative DC potential, i.e., in the AFT system shown in the Figure, ground potential. The DC output signal of DC amplifier 56 is supplied to the terminals 60 and 61 of switches S1 and S2 respectively.

Clipper 57 consists of a Zener diode 62 and resistors R13 and R14 connected in voltage divider configuration between conductors 63 and 59. The anode of Zener diode 62 is connected to the common terminal of resistors R13 and R14, while the cathode of the Zener diode is connected to the movable contact 64 of switch S1.

Connected between conductor 63 and ground is a Zener diode 65 that keeps conductor 63 at a fixed DC potential corresponding to the Zener voltage of diode 65. This voltage is applied across a voltage divider consisting of resistors R15 and R16. The common terminal of these resistors is connected to a terminal 66 of switch S2, and, in this manner, a constant DC potential having a magnitude that depends upon the relative magnitudes of resistors R15 and R16 and the Zener voltage of diode 65 is supplied to terminal 66. By way of illustration, the DC potential at terminal 66 will be assumed to be +4.7 volts.

Switch S2 also has terminals 67, 68 and 69 and movable contacts 70 and 71 ganged together. Terminal 69 is connected via a lamp 72 to conductor 59, while terminal 68 is connected to a suitable AC supply for the lamp. Terminal 61 is connected to a device having a characteristic that varies with the magnitude of the voltage applied to it and which, being connected in circuit with oscillator 17 as a frequency determining element, varies the frequency of the output signal produced by oscillator 17 in response to variations in the magnitude of the voltage applied to the device. In the present system this device is a varactor diode VD1 connected in circuit with oscillator 17 and having its cathode connected to terminal 61. Varactor diode VD1 constitutes a frequency determining element or device for oscillator 17. A varactor diode is a device having a capacitance that varies with the voltage applied to the device. As the capacitance of the varactor diode changes, so does the capacitance in the oscillator circuit and the frequency of the output signal generated by the oscillator. The possibility of substituting current sensitive or polarity sensitive devices for varactor diode VD1 exists.

Figure 5:
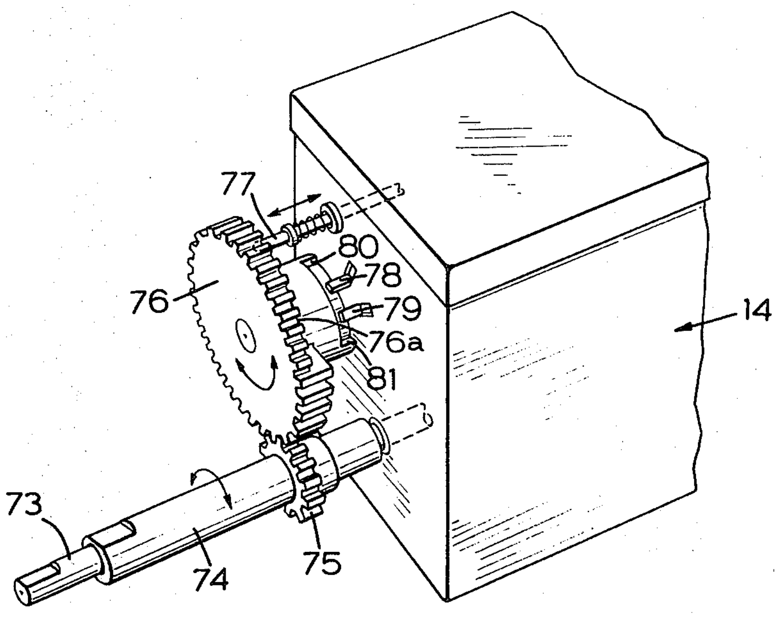
FIG. 5 is a perspective view, partly broken away, of a tuner that may be used in the practice of a preferred embodiment of this invention; and FIGS. **6*a* and 6*b*** are circuit diagrams, partly in block form, of a color television receiver having a tuning system that constitutes a preferred embodiment of the invention.

Referring now to FIG. 5, tuner 14 is shown therein. Tuner 14 is a conventional turret-type tuner that has been modified to render it suitable for use in a preferred embodiment of this invention and is sold by Standard Coil Limited, Toronto, Ontario, Canada, under No. SBRMGC-161. The coarse tuning (channel selector) and manual fine tuning knobs of the tuner have not been shown for the sake of clarity. The channel selector knob is secured to a rotatable shaft 73 mounted coaxially within a rotatable shaft 74 to which the manual fine tuning knob of the tuner is secured. Coarse tuning (channel selection) is effected by rotating shaft 73. The effect of rotating shaft 73 is to substitute coils (one coil for each channel) having different inductances for coil L1 in the tank circuit of oscillator 17 and also may be to effect broad tuning of RF amplifier 15. Each coil is factory tuned so that with the manual fine tuning control centered, when a channel is selected, the corresponding coil will cause oscillator 17 to generate a signal which, when supplied to mixer 16, will heterodyne with the video carrier of the television signal for the channel selected to produce a tuner output signal having a video carrier frequency of 45.75 MHz., i.e., the video carrier intermediate frequency of the receiver or, the frequency to which the IF system of the receiver is tuned.

Shaft 74 has a gear 75 fixed thereto that drives a gear 76 rotatably mounted on the housing of tuner 14. On the back of gear 76 is a cam surface 76*a* against which a spring-loaded plunger 77 or cam follower bears. Movement of plunger 77 is effective to vary the impedance of coil L2 (FIG. 6*a*). Projecting from the housing of tuner 14 are two spaced-apart fingers or stop members 78 and 79 that are effective to engage shoulders or abutments 80 and 81 respectively on gear 76 to restrict the movement of gear 76 to less than one complete revolution.

Manual fine tuning is effected by rotation of shaft 74 and consequent movement of plunger 77. This has the effect on each channel of changing the impedance of coil L2 and hence the frequency of the signal produced by local oscillator 17 over a range in which there is provided a signal which, when heterodyned with the video carrier of the signal for the channel selected by the operator, will provide an output signal from tuner 14 that has a video carrier frequency the same as the video carrier intermediate carrier of the receiver.

The movable contact 64 of switch S1 (FIG. 6*b*) is operated by shaft 73. The arrangement is such that switch S1 is open when the tuner is tuned to any one of the low frequency VHF channels 2–6 inclusive and closed when the tuner is tuned to any one of higher frequency VHF channels 7—13 inclusive.

The operation of a preferred embodiment of the instant invention now will be discussed in detail. The object of using an AFT system in a television receiver is to maintain the intermediate frequency of the video carrier, as produced by the heterodyning of the signal produced by the local oscillator with the video carrier of the television signal to which the tuner is tuned at a precise predetermined frequency, presently 45.75 MHz., in spite of local oscillator drifting, manual detuning, etc. In a color television receiver that is receiving a color signal, the effects of the video intermediate frequency carrier going above 45.75 MHz. in frequency are stronger chroma (more saturation), stronger sound, sharper picture and objectionable sound interference, while the effects of the video intermediate frequency carrier so produced being below 45.75 MHz. in frequency are weaker chroma to the point of loss of color, weaker sound to the point of loss of audio and loss of picture detail.

A conventional AFT system usually involves a 45.75 MHz. frequency discriminator supplied with video IF signal so as to produce a voltage error signal that is proportional to the deviation in frequency of the carrier of the video IF signal from 45.75 MHz. and also the coupling of a voltage variable capacitance diode to the frequency determining tuned circuit of the local oscillator, such that application of the voltage error signal from the discriminator to the diode causes retuning of the local oscillator in a direction to bring the frequency of the carrier of the video IF signal automatically back to 45.75 MHz. Of course, in any practical system complete retuning will not be realized, i.e., there will be some finite, steady state, IF error (deviation from 45.75 MHz.), the magnitude of which, like all closed loop feedback systems, will be inversely proportional to the system loop gain.

With reference to FIG. 6*a*, tuned IF amplifier 54 is tuned to the intermediate frequency to which the IF system of the receiver is tuned, i.e. 45.75 MHz., and is supplied with a video IF signal from the third IF amplifier of the receiver via the stray capacitance of resistor R17. The input signal to IF amplifier 54 thus has a carrier having the same frequency as the frequency of the video carrier of the output signal of tuner 14, the input signal carrier being derived from or, more specifically, in the present case, actually being the video carrier of the tuner output signal. The amplified video IF signal at the collector electrode of the transistor TR2 is fed to the input terminal 82 of IF discriminator 55. Discriminator 55 is aligned so as to provide a predetermined DC reference voltage, 0 volts in the system shown, when the carrier frequency of the signal applied to its input terminal 82 is 45.75 MHz. and to produce DC error voltages above (more positive) and below (more negative) the reference voltage if the frequency of the carrier of the video IF input signal deviates above or below 45.75 MHz. The voltage error signal derived from IF discriminator 55 is supplied to DC amplifier 56, and the bias of this DC amplifier is adjusted by variable resistor R18 to give +4.7 volts collector to ground for a discriminator error signal of zero. This +4.7 volts is the so-called reference voltage or normal varactor diode bias for which local oscillator 17 originally was aligned. The particular voltage of +4.7 volts was chosen because it represents approximately one-half capacitance on the varactor diode capacitance vs. voltage characteristic. Obviously, the particular voltage is not critical, and the optimum voltage may vary from diode to diode. The amplified error signal that appears at terminal 61 is applied to varactor diode VD1 to close the feedback loop when the AFT switch S2 is in the AFT on position, this being the position shown in FIG. 6 with contact 70 bridging terminals 61 and 67 and contact 71 bridging terminals 68 and 69. Switch S2 is a manually operated switch, and, when in the AFT on position, a visual indication that the AFT is on is given by the illumination of lamp 72.

With AFT switch S2 in the off position, lamp 72 is extinguished and contact 70 bridges terminals 66 and 67. Thus, terminal 66 at a potential of +4.7 volts, i.e., the same potential as is present at the collector electrode of transistor TR1 with AFT system 53 abled and an input signal having a carrier frequency the same as the intermediate frequency to which the IF system of the receiver is tuned applied to the base electrode of transistor TR2, is connected to varactor diode VD1 and supplies to the diode the voltage for which the local oscillator was originally aligned, it being understood that the local oscillator slugs for coils L1 are factory adjusted for each VHF channel such that with the manual fine tuning control centered and +4.7 volts applied to diode D1, the video IF output signal of tuner 14 has a carrier frequency of 45.75 MHz. (AFT off).

If at the time that AFT system 53 is switched on, the manual fine tuning control is off center such that the frequency of the signal generated by local oscillator 17 is low and the carrier frequency of the video IF signal thus is below 45.75 MHz., discriminator 55 will see a frequency deviation from 45.75 MHz. and will produce a negative output voltage. This negative output voltage is seen by DC amplifier 56 in series with its quiescent forward bias, such that the net forward bias of transistor TR1 is reduced increasing the collector voltage of the transistor and the bias voltage of varactor diode VD1 above +4.7 volts. This decreases the capacitance of diode VD1 which, being part of the local oscillator tuned circuit, causes the frequency of the output signal of local oscillator 17 to increase and the carrier frequency of the video IF signal to increase towards 45.75 MHz. If the frequency of the local oscillator output signal had been high, the discriminator 56 would produce a positive output voltage, the net forward bias of transistor TR1 would be increased, the voltage supplied to diode VD1 would be decreased and the frequency of the output signal produced by oscillator 17 would be decreased to decrease the carrier frequency of the video IF signal back towards 45.75 MHz.

Figure 2:
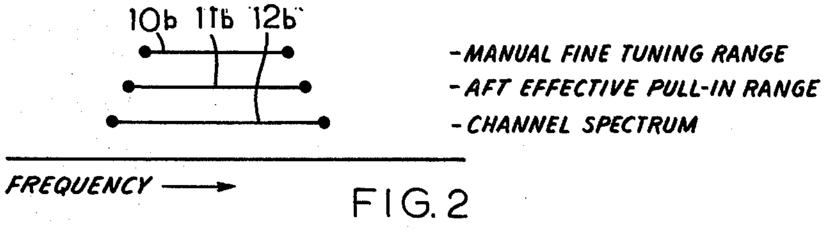
FIG. 2 is a graph showing the same ranges as in FIG. 1 but for a color television receiver constituting a preferred embodiment of this invention.

With the exception of the operation of DC amplifier 56, the foregoing is essentially a description of the operation of a conventional AFT system. In accordance with a preferred embodiment of the instant invention, and, as shown in FIG. 2, an AFT pull-in range that is wider than the manual fine tuning range on all VHF channels is provided. This can be achieved in part by increasing the AFT pull-in range of a conventional AFT system by the inclusion of DC amplifier 56, in part by restricting the manual fine tuning range by stops 78 and 79 and abutments 80 and 81 (FIG. 5) and in part by increasing the coupling of varactor diode VD1 to the local oscillator.

Figure 3:
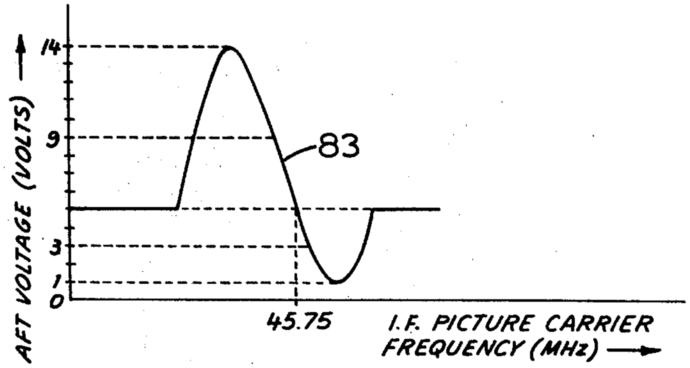
FIG. 3 is a graph on a plot of voltage against frequency showing the effective discriminator characteristic of an FM discriminator used in a preferred embodiment of this invention.

Although if discriminator 55 produces zero output when the video IF signal,applied to its input terminal 82 has a carrier frequency of 45.75 MHz., the effect of the inclusion of DC amplifier 56 is that discriminator 55 can be considered to have the characteristic 83 shown in FIG. 3. The characteristic S curve of the discriminator shows a 13 volt AFT voltage swing, this being due to the presence of amplifier 56, and an output voltage of +4.7 volts at an input frequency of 45.75 MHz., this being the collector to ground voltage of transistor TR1 for a discriminator error signal of zero.

Figure 4:
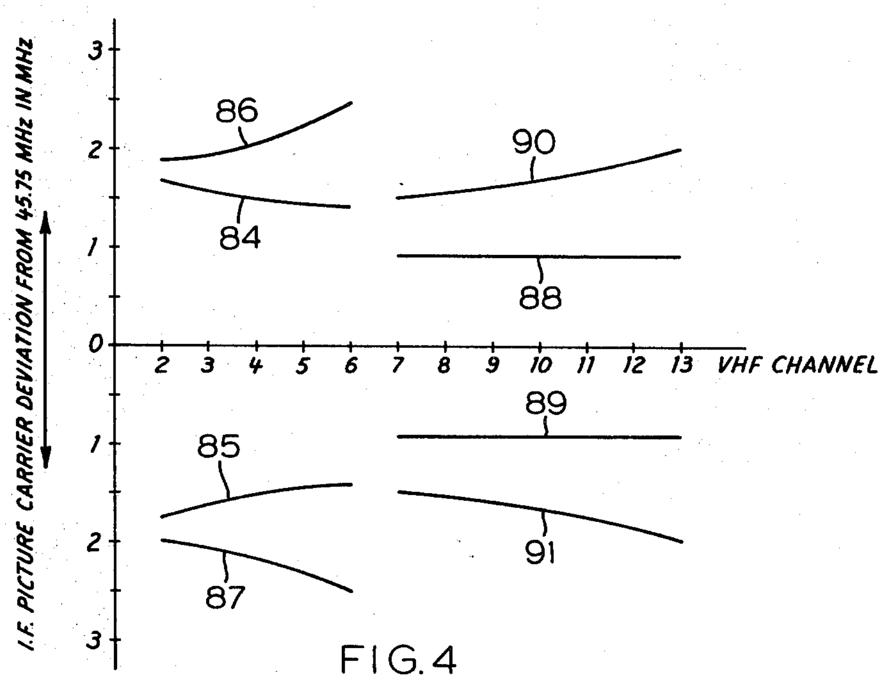
FIG. 4 is a graph on a plot of frequency against VHF channel number showing the AFT pull-in ranges and manual fine tuning ranges of a preferred embodiment of this invention.

The effect of the foregoing modifications insofar as the low VHF channels, channels 2—6 inclusive are concerned, is shown in FIG. 4 where lines 84 and 85 designate the limits of manual fine tuning, while lines 86 and 87 designate the limits of the AFT effective pull-in range. It will be seen by reference to FIG. 4 that on the low channels a manual fine tuning range that averages about 3 MHz. is provided, while the average AFT pull-in range is about 4.5 MHz. It will be appreciated, of course, that these values may be varied. As stated hereinbefore, the manual fine tuning range should be sufficient to indicate to an operator that he has tuned through an optimum position. The AFT pull-in range, in a preferred embodiment of the invention, must encompass the manual fine tuning range, but it must not be so wide as to give rise to the possibility of the system locking on adjacent channel carriers. This defect usually is referred to as "lockout" and, of course, is extremely undesirable. In general, it can be said that the AFT pull-in range should not be below the upper adjacent video carrier side bands and not above the lower adjacent audio sidebands.

With the foregoing in mind, it is for the purpose of preventing "lockout" that clipper 57 is provided. Because of the fact that the change in varactor diode capacitance required for a particular change in the frequency of the output signal of oscillator 17 is inversely proportional to the frequency of the output signal, i.e., at high frequencies a given percentage change in varactor diode capacitance will produce a greater change in frequency than at low frequencies, an AFT system that provides an adequate pull-in range on low channels may give an excessive pull-in range on high channels. This excessive AFT pull-in range on high channels can be reduced by restricting the dynamic range of the diode bias for varactor diode VD1 from DC amplifier 56 on high channels. This is achieved by clipper 57.

As aforementioned, switch S1 is closed on high channels (frequency of the output signal of oscillator 17 equal to or greater than that required for channel 7) and open on low channels (frequency of the output signal of oscillator 17 equal to or lower than that required for channel 6), movable contact 64 of switch S1 being operated by shaft 73. When switch S1 is closed, clipper 57 is abled, the clipper being disabled when switch S1 is open. Resistors R14 and R13 form a divider that establishes a potential of, say, +3 volts for the anode of Zener diode 62. When switch S1 is closed, if the collector voltage of transistor TR1 attempts to decrease below +3 volts, diode 62 will be forward biased and will clip the voltage error signal from DC amplifier 56 at about +3 volts. IF the collector voltage of transistor TR1 attempts to increase above +9 volts, assuming a Zener voltage of 6 volts, diode 62 will conduct in the Zener mode clipping the voltage error signal at about +9 volts. These levels are shown in FIG. 3. In this manner the DC error voltage supplied to varactor diode VD1 is limited on high channels to a range (about 6 volts) that is less than the range (about 13 volts) of the DC voltages adapted to be applied to diode VD1 when clipper 57 is disabled. This is achieved, however, without changing the +4.7 volt reference level. In addition, and as required, the +4.7 volt reference voltage on high channels still is intermediate the upper (+9) and lower (+3) voltages of the error voltage range.

It should be appreciated that the specific voltages described in the preceding paragraph are illustrative only, and that other voltages may be selected.

Referring to FIG. 4, the lines 88 and 89 define between them the manual fine tuning range on high channels, while the lines 90 and 91 define between them the AFT pull-in range on high channels.

From the foregoing it will be seen that with switch S2 in the AFT off position, lamp 72 will not be illuminated and a DC voltage, +4.7 volts in the disclosed system, that is the same as the DC voltage derived from the discriminator 55-DC amplifier 56 combination when the carrier frequency of the signal applied to input terminal 82 is the same as the video carrier intermediate frequency of the receiver, will be applied to varactor diode VD1, this DC voltage being derived from the source consisting of $B^+$, Zener diode 65 and resistors R15 and R16. This DC voltage also corresponds to the voltage originally applied to varactor diode VD1 in aligning coils L1 of oscillator 17. Coarse tuning is effected by rotating shaft 73 until the desired channel is selected. Manual fine tuning is effected by rotating shaft 74. This results in movement in or out of plunger 77 and consequent changes in the impedance of coil L2. This in turn varies the frequency of the output signal of local oscillator 17 and the frequency of the video carrier of the output signal of tuner 14 but within the limits defined by lines 84 and 85 and lines 88 and 89 in FIG. 4, restriction of the manual fine tuning range resulting from the engagement of stop numbers 78 and 79 with abutments 80 and 81 respectively.

With switch S2 in the AFT on position, lamp 72 will be illuminated. Assuming that one of channels 2—6 has been selected, switch S1 will be open. If tuner 14 is properly tuned, the carrier frequency of the signal applied to input terminal 82 of discriminator 55 will be the same as the frequency to which the IF system of the receiver is tuned, the output of discriminator 55 will be 0 volts, the output of DC amplifier 56 will be +4.7 volts, i.e., the normal bias for varactor diode VD1, and this will be applied to varactor diode VD1 with no change in the frequency of the output signal of oscillator 17 resulting. However, if, due to oscillator drift, for example, the video carrier frequency of the output signal of tuner 14 and hence the carrier frequency of the signal applied to input terminal 82 should deviate above or below the video carrier intermediate frequency of the receiver, the output of discriminator 55 will be a positive or negative voltage respectively of a magnitude proportional to the frequency deviation, the output of DC amplifier 56 will be a DC voltage below or above respectively +4.7 volts and of a magnitude proportional to the frequency deviation, and this error signal will be applied to varactor diode VD1 to change its capacitance and the frequency of the output signal of local oscillator 17 in a direction to correct the deviation. The same result will be achieved in the same way if one of channels 7—13 is selected except, in this instance, switch S1 will be closed abling clipper 62 and restricting the range over which the error voltage at the output terminal of DC amplifier 56 may vary, i.e., the pull-in range of the AFT system.

Whether a low channel or a high channel has been selected, the frequency spectrum over which the video carrier frequency of the output signal of tuner 14 can be varied by rotation of shaft 74 is wholly within the AFT pull-in range of the AFT system 53 of the receiver as shown in FIG. 4.

It should be apparent from the foregoing that conventional mechanical preset fine tuning is not required in a tuner 14 used in the practice of this invention. Thus, a conventional tuner having preset fine tuning can be modified to eliminate the intricate mechanics that are associated with preset fine tuning.

In its broadest aspect the instant invention contemplates an automatic frequency control system which, when activated, is effective to automatically vary the frequency of the local oscillator signal in a direction to correct a deviation in the carrier frequency of the tuner output signal from the frequency to which the IF system of the receiver is tuned regardless of any mistuning of the oscillator by the fine tuning means of the receiver prior to activation of the automatic frequency control system. In a preferred embodiment of the invention the frequency spectrum within which the carrier frequency of the signal produced by the tuner by heterodyne action can be varied by the fine tuning means of the receiver is wholly within the frequency spectrum over which the automatic frequency control system is capable of automatically varying the carrier frequency of the tuner output signal in a direction to correct a deviation in the carrier frequency of the tuner output signal from the frequency to which the IF system of the receiver is tuned. It must be appreciated, however, that this is a preferred embodiment of the basic invention recited at the commencement of this paragraph, and it is contemplated that other means might be employed, without departing from the broadest aspect of this invention, for rendering an AFT system effective to automatically vary the frequency of the local oscillator signal in a direction to correct a deviation in the carrier frequency of the tuner output signal from the frequency to which the IF system of the receiver is tuned regardless of any mistuning of the oscillator by the fine tuning means of the receiver prior to activation of the automatic frequency control system. In the specific preferred embodiment of the invention disclosed herein the fine tuning means of the receiver are restricted to vary the carrier frequency of the tuner output signal within a frequency spectrum that is wholly within the AFC pull-in range of the AFC system of the receiver. It is to be understood that reference in the appended claims to the fine tuning means being restricted contemplates and is intended to encompass a system in which the result stated at the commencement of this paragraph is achieved by expansion of the AFC pull-in range alone, contraction of the range over which the manual fine tuning means may be varied alone, or both, since, in any one of these three cases, it is inherent that a restriction is imposed on the fine tuning means that prevents the fine tuning means from effecting a change in frequency of the output signal of the local oscillator and hence in the carrier frequency of the tuner output signal that is beyond the capability of the AFT system to correct.

While the invention has been described herein in the environment of a color television receiver, it may be used in a black and white television receiver and in other receivers of the superheterodyne-type that are provided with some form of coarse tuning means and some form of fine tuning means.

What we claim as our invention is:

1. In a superheterodyne signal receiver of a type having a tuner including an oscillator, said tuner being adapted to receive input signals having various carrier frequencies and to provide output signals having different carrier frequencies than the carrier frequencies of said input signals and varying over a range including a predetermined frequency, coarse tuning means for varying the frequency of the signal produced by said oscillator to provide a signal which, when heterodyned with one of said input signals, provides a tuner output signal having a carrier frequency within said range, fine tuning means for varying the frequency of the signal produced by said oscillator over a range in which there is provided a signal which, when heterodyned with said one input signal, provides a tuner output signal having a carrier having said predetermined frequency, and automatic frequency control means operable in response to a deviation in the carrier frequency of said output signal of said tuner from said predetermined frequency to automatically vary the frequency of the signal produced by said oscillator in a direction to correct said deviation; the improvement wherein the frequency spectrum within which the carrier frequency of said output signal of said tuner can be varied by said fine tuning means is wholly within the frequency spectrum over which said automatic frequency control means, when abled, is capable of automatically varying the carrier frequency of said output signal of said tuner in a direction to correct a deviation in said carrier frequency of said output signal of said tuner from said predetermined frequency, whereby said fine tuning means is inhibited from mistuning said oscillator to a point at and beyond which said automatic frequency control means, when abled, is ineffective to correct such mistuning.

2. The invention according to claim 1 wherein said automatic frequency control means includes a device having a characteristic that varies with the magnitude of the voltage applied to said device, said device being connected in circuit with said oscillator as a frequency determining element to vary the frequency of the output signal produced by said oscillator in response to variations in the magnitude of said voltage applied to said device, FM discriminator means having an input terminal and an output terminal, and means connecting said output terminal of said discriminator means and said device to apply a voltage to said device that varies in magnitude with the carrier frequencies of signals applied to said input terminal of said discriminator means, said carrier of said signals applied to said input terminal being derived from or being the carrier of said output signal of said tuner, said FM discriminator means being adapted, when said automatic frequency control means is abled, to derive and apply a predetermined DC reference voltage to said device in response to application to said input terminal of a signal having said predetermined carrier frequency and further being adapted to derive and apply DC voltages above and below said reference voltage to said device in response to application to said input terminal of signals having carrier frequencies higher and lower than said predetermined carrier frequency.

3. The invention according to claim 2 wherein said device is a varactor diode and said characteristic is capacitance.

4. The invention according to claim 2 including a clipper for limiting the magnitude of said DC voltages to a range that is less than the range of said DC voltages adapted to be applied to said device when said clipper is disabled, said reference voltage being intermediate the upper and lower voltages of said range to which said DC voltages are limited, and means responsive to said coarse tuning means being operated to cause said oscillator to provide a signal having a frequency equal to or above a predetermined oscillator signal frequency for connecting said clipper in circuit with said output terminal and responsive to said coarse tuning means being operated to cause said oscillator to provide a signal having a frequency below said predetermined oscillator signal frequency for disabling said clipper, whereby the pull-in range of said automatic frequency control means is less when said oscillator is providing signals equal to or above said predetermined oscillator signal frequency than it would be when said clipper is disabled.

5. The invention according to claim 4 wherein said device is a varactor diode and said characteristic is capacitance.

6. The invention according to claim 5 wherein said superheterodyne signal receiver is a television receiver.

7. The invention according to claim 6 including a source of DC potential providing a DC voltage equal in magnitude to said predetermined DC reference voltage, means for abling and disabling said automatic frequency control means, and means responsive to disabling of said automatic frequency control means for connecting said source of DC potential and said device to apply said DC voltage of said source to said device.

8. The invention according to claim 2 wherein said means connecting said output terminal and said device comprise a DC amplifier.

9. The invention according to claim 8 including a clipper for limiting the magnitude of said DC voltages to a range that is less than the range of said DC voltages adapted to be applied to said device when said clipper is disabled, said reference voltage being intermediate the upper and lower voltages of said range to which said DC voltages are limited, and means responsive to said coarse tuning means being operated to cause said oscillator to provide a signal having a frequency equal to or above a predetermined oscillator signal frequency for connecting said clipper in circuit with said output terminal and responsive to said coarse tuning means being operated to cause said oscillator to provide a signal having a frequency below said predetermined oscillator signal frequency for disabling said clipper, whereby the pull-in range of said automatic frequency control means is less when said oscillator is providing signals equal to or above said predetermined oscillator signal frequency than it would be when said clipper is disabled.

10. The invention according to claim 9 wherein said device is a varactor diode and said characteristic is capacitance.

11. The invention according to claim 10 wherein said superheterodyne signal receiver is a television receiver.

12. The invention according to claim 11 including a source of DC potential providing a DC voltage equal in magnitude to said predetermined DC reference voltage, means for abling and disabling said automatic frequency control means, and means responsive to disabling of said automatic frequency control means for connecting said source of DC potential and said device to apply said DC voltage of said source to said device.

13. The invention according to claim 12 wherein said means for connecting said clipper in circuit with said output terminal and for disabling said clipper comprise means connecting said clipper in circuit with said output terminal in response to selection of any one of VHF channels 7 to 13 inclusive and disabling said clipper in response to selection of any one of VHF channels 2 to 6 inclusive.

14. The invention according to claim 2 wherein said superheterodyne signal receiver is a television receiver.

15. The invention according to claim 2 including a source of DC potential providing a DC voltage equal in magnitude to said predetermined DC reference voltage, means for abling and disabling said automatic frequency control means, and means responsive to disabling of said automatic frequency control means for connecting said source of DC potential and said device to apply said DC voltage of said source to said device.

16. In a superheterodyne signal receiver of a type having a tuner including an oscillator, said tuner being adapted to receive input signals having various carrier frequencies and to provide output signals having different carrier frequencies than the carrier frequencies of said input signals and varying over a range including a predetermined frequency, coarse tuning means for varying the frequency of the signal produced by said oscillator to provide a signal which, when heterodyned with one of said input signals, provides a tuner output signal having a carrier frequency within said range, fine tuning means for varying the frequency of the signal produced by said oscillator over a range in which there is provided a signal which, when heterodyned with said one input signal, provides a tuner output signal having a carrier having said predetermined frequency, and automatic frequency control means operable in response to a deviation in the carrier frequency of said output signal of said tuner from said predetermined frequency to automatically vary the frequency of the signal produced by said oscillator in a direction to correct said deviation; the improvement comprising means restricting said fine tuning means to vary the carrier frequency of said output signal of said tuner within a frequency spectrum that is wholly within the frequency spectrum over which said automatic frequency control means, when abled, is capable of automatically varying the carrier frequency of said output signal of said tuner in a direction to correct a deviation in said carrier frequency of said output signal of said tuner from said predetermined frequency, whereby said fine tuning means is inhibited from mistuning said oscillator to a point at and beyond which said automatic frequency control means, when abled, is ineffective to correct such mistuning.

17. The invention according to claim 16 wherein said automatic frequency control means includes FM discriminator means having an input terminal and an output terminal, a device having a characteristic that varies with the magnitude of the voltage applied to said device, said device being connected in circuit with said oscillator as a frequency determining element to vary the frequency of the output signal produced by said oscillator in response to variations in the magnitude of said voltage applied to said device, and means connecting said output terminal of said discriminator and said device to apply a voltage to said device that varies in magnitude with the carrier frequencies of signals applied to said input terminal of said discriminator, said carrier of said signals applied to said input terminal being derived from or being the carrier of said output signal of said tuner, said FM discriminator means being adapted, when said automatic frequency control means is abled, to derive and apply a predetermined DC reference voltage to said device in response to application to said input terminal of a signal having said predetermined carrier frequency and further being adapted to derive and apply DC voltages above and below said reference voltage to said device in response to application to said input terminal of signals having carrier frequencies higher and lower than said predetermined carrier frequency.

18. The invention according to claim 17 including a clipper for limiting the magnitude of said DC voltages to a range that is less than the range of said DC voltages adapted to be applied to said device when said clipper is disabled, said reference voltage being intermediate the upper and lower voltages of said range to which said DC voltages are limited, and means responsive to said coarse tuning means being operated to cause said oscillator to provide a signal having a frequency equal to or above a predetermined oscillator signal frequency for connecting said clipper in circuit with said output terminal and responsive to said coarse tuning means being operated to cause said oscillator to provide a signal having a frequency below said predetermined oscillator signal frequency for disabling said clipper, whereby the pull-in range of said automatic frequency control means is less when said oscillator is providing signals equal to or above said predetermined oscillator signal frequency than it would be when said clipper is disabled.

19. The invention according to claim 18 wherein said means connecting said output terminal and said device comprise a DC amplifier.

20. The invention according to claim 18 wherein said superheterodyne signal receiver is a television receiver, said device is a varactor diode and said characteristic is capacitance.

21. The invention according to claim 20 including a source of DC potential providing a DC voltage equal in magnitude to said predetermined DC reference voltage, means for abling and disabling said automatic frequency control means, and means responsive to disabling of said automatic frequency control means for connecting said source of DC potential and said device to apply said DC voltage of said source to said device.

22. The invention according to claim 21 wherein said means for connecting said clipper in circuit with said output terminal and for disabling said clipper comprise means connecting said clipper in circuit with said output terminal in response to selection of any one of VHF channels 7 to 13 inclusive and disabling said clipper in response to selection of any one of VHF channels 2 to 6 inclusive.

23. The invention according to claim 22 wherein said means connecting said output terminal and said device comprise a DC amplifier.

24. In a superheterodyne signal receiver of a type having a tuner including an oscillator, said tuner being adapted to receive input signals having various carrier frequencies and to provide output signals having different carrier frequencies than the carrier frequencies of said input signals and varying over a range including a predetermined frequency, coarse tuning means for varying the frequency of the signal produced by said oscillator to provide a signal which, when heterodyned with one of said input signals, provides a tuner output signal having a carrier frequency within said range, fine tuning means for varying the frequency of the signal produced by said oscillator over a range in which there is provided a signal which, when heterodyned with said one input signal, provides a tuner output signal having a carrier having said predetermined frequency, and automatic frequency control means operable in response to a deviation in the carrier frequency of said output signal of said tuner from said predetermined frequency to automatically vary the frequency of the signal produced by said oscillator in a direction to correct said deviation; the improvement comprising means restricting said fine tuning means from mistuning said oscillator to a point at and beyond which said automatic frequency control means, when abled, is ineffective to correct such mistuning.